United States Patent
Rudolph et al.

(10) Patent No.: US 7,892,646 B1
(45) Date of Patent: *Feb. 22, 2011

(54) PRESSURE GRADIENT CVI/CVD PROCESS

(75) Inventors: James W. Rudolph, Colorado Springs, CO (US); Vincent Fry, Santa Fe Springs, CA (US)

(73) Assignee: Goodrich Corporation, Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/109,946

(22) Filed: Apr. 25, 2008

Related U.S. Application Data

(63) Continuation of application No. 11/732,719, filed on Apr. 4, 2007, now abandoned.

(51) Int. Cl.
*B32B 9/00* (2006.01)
(52) U.S. Cl. .................................................. 428/408
(58) Field of Classification Search .................. 428/408
See application file for complete search history.

(56) References Cited

U.S. PATENT DOCUMENTS 5,916,633 A * 6/1999 Lackey et al. ............ 427/249.3
6,780,462 B2 * 8/2004 Purdy et al. .............. 427/248.1

* cited by examiner

*Primary Examiner*—Angela Ortiz
*Assistant Examiner*—Daniel Miller
(74) *Attorney, Agent, or Firm*—Snell & Wilmer L.L.P.

(57) ABSTRACT

A pressure gradient CVI/CVD process includes providing a furnace defining an outer volume. Porous structures and ring-like spacers are assembled in a stack with a ring-like spacer between each adjacent pair of porous structures. The stack of porous structures is disposed between a bottom plate and a top plate in the furnace, wherein the bottom plate, the stack of porous structures, and the ring-like spacers define an enclosed cavity. A channel provides fluid communication between the enclosed cavity and the outer volume. A gas composition is introduced into the enclosed cavity. A portion of the gas composition flows through the channel. A pressure gradient is maintained between the enclosed cavity and the outer volume. The gas composition in the outer volume is provided at a pressure of at least about 15 torr. The porous structures are densified.

34 Claims, 9 Drawing Sheets

PRESSURE GRADIENT CVI/CVD PROCESS

CROSS-REFERENCES TO RELATED APPLICATIONS

This application is a continuation of U.S. application Ser. No. 11/732,719 filed Apr. 4, 2007 now abandoned.

FIELD OF THE INVENTION

The invention relates to the field of high temperature composites made by the chemical vapor infiltration and deposition of a binding matrix within a porous structure. More particularly, the invention relates to pressure gradient processes for forcing infiltration of a reactant gas into a porous structure.

BACKGROUND

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, *Deposition of Pyrolytic Carbon in Porous Solids,* 8 Chemistry and Physics of Carbon, 173, 190-203 (1973); W. J. Lackey, *Review, Status, and Future of the Chemical Vapor Infiltration Process for Fabrication of Fiber-Reinforced Ceramic Composites,* Ceram. Eng. Sci. Proc. 10[7-8] 577, 577-81 (1989) (W. J. Lackey refers to the pressure gradient process as "isothermal forced flow").

In what is referred to herein as a conventional isothermal CVI/CVD process, a reactant gas passes around a heated porous structure at absolute pressures as low as a few millitorr. The gas diffuses into the porous structure driven by concentration gradients and cracks to deposit a binding matrix. This process has also been referred to as "conventional CVI/CVD" or simply "isothermal CVI/CVD." The porous structure is heated to a more or less uniform temperature, hence the term "isothermal," but this is actually a misnomer. Some variations in temperature within the porous structure are inevitable due to uneven heating (essentially unavoidable in most furnaces), cooling of some portions due to reactant gas flow, and heating or cooling of other portions due to heat of reaction effects. In essence, "isothermal" means that there is no attempt to induce a thermal gradient that preferentially affects deposition of a binding matrix. This process is well suited for simultaneously densifying large quantities of porous articles and is particularly suited for making carbon/carbon brake disks. With appropriate processing conditions, a matrix with desirable physical properties can be deposited. However, conventional isothermal CVI/CVD may require weeks of continual processing in order to achieve a useful density, and the surface tends to densify first resulting in "seal-coating" that prevents further infiltration of reactant gas into inner regions of the porous structure. Thus, this technique generally requires several surface machining operations that interrupt the densification process.

In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface. The equipment for a thermal gradient process tends to be complex, expensive, and difficult to implement for densifying relatively large quantities of porous structures.

In a pressure gradient CVI/CVD process, the reactant gas is forced to flow through the porous structure by inducing a pressure gradient from one surface of the porous structure to an opposing surface of the porous structure. Flow rate of the reactant gas is greatly increased relative to the isothermal and thermal gradient processes which results in increased deposition rate of the binding matrix. This process is also known as "forced-flow" CVI/CVD. Prior fixtures for pressure gradient CVI/CVD tend to be complex, expensive, and difficult to implement for densifying large quantities of porous structures.

Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure. The equipment to implement such a process is complex, expensive, and difficult to maintain. This process is very difficult to implement for densifying large numbers of porous structures.

Many workers in the art have combined the thermal gradient and pressure gradient processes resulting in a "thermal gradient-forced flow" process. Combining the processes appears to overcome the shortcomings of each of the individual processes and results in very rapid densification of porous structures. However, combining the processes also results in twice the complexity since equipment must be provided to induce both thermal and pressure gradients with some degree of control. Furthermore, prior art processes densify only one porous article at a time, which is impractical for simultaneously processing large numbers of composite articles such as carbon/carbon brake disks.

Previous patents have disclosed pressure gradient CVI/CVD processes and apparatus, such as U.S. Pat. No. 5,480,678, entitled "Apparatus for Use with CVI/CVD Processes," and U.S. Pat. No. 5,853,485, entitled "Pressure Gradient CVI/CVD Apparatus Process and Product." Previous processes frequently required multiple densification steps, with the porous structures requiring rearrangement and machining between steps in order to achieve acceptable densification results in the final product. The rearrangement and machining between cycles is costly and time-consuming.

Thus, in spite of these advances, a CVI/CVD process and an apparatus for implementing that process are desired that rapidly and uniformly densifies porous structures while minimizing cost and complexity. Such a process would preferably be capable of simultaneously densifying large numbers (as many as hundreds) of individual porous structures in a single step. In particular, a process is desired for rapidly and economically densifying large numbers of annular fibrous preform structures for aircraft brake disks having desirable physical properties.

BRIEF SUMMARY

In various aspects, a pressure gradient CVI/CVD densification process densifies porous structures in a single cycle and in a shorter time than previous processes. The resulting densified structures have acceptable properties for use as brake disks, including density, open and closed porosity, and a matrix deposit with a rough laminar microstructure.

In one aspect, a process for densifying porous structures inside a furnace includes providing a furnace defining an outer volume. A multitude of porous structures and ring-like spacers are assembled in a stack with a ring-like spacer between each adjacent pair of porous structures. The stack of porous structures is disposed between a bottom plate and a top plate in the furnace, wherein the bottom plate, the stack of porous structures, and the ring-like spacers define an enclosed cavity extending from the bottom plate, including each porous structure aperture, and terminating proximate the top plate. A channel provides fluid communication between the enclosed cavity and the outer volume. A gas composition is introduced into the enclosed cavity. A portion of the gas composition flows through the channel. A pressure gradient is maintained between the enclosed cavity and the outer volume. The gas composition in the outer volume is provided at an initial pressure of at least about 15 torr. The porous structures are densified using pressure gradient CVI/CVD.

In another aspect, a gas composition is introduced into the enclosed cavity. The gas composition comprises between 5% and 20% highly reactive gas at the start of the densification process, and the amount of highly reactive gas decreases during the densification process. A portion of the gas composition flows through the channel. A pressure gradient is maintained between the enclosed cavity and the outer volume. The gas composition in the outer volume is provided at an initial pressure. The porous structures are densified using pressure gradient CVI/CVD.

In another aspect, a densified porous structure includes carbon fibers and a deposited carbon matrix. The densified porous structure has a bulk density of at least 1.75 g/cm$^3$ and a core density. The difference between the core density and the bulk density is less than 0.025 g/cm$^3$.

The foregoing paragraphs have been provided by way of general introduction, and are not intended to limit the scope of the following claims.

DETAILED DESCRIPTION

Figure 1:
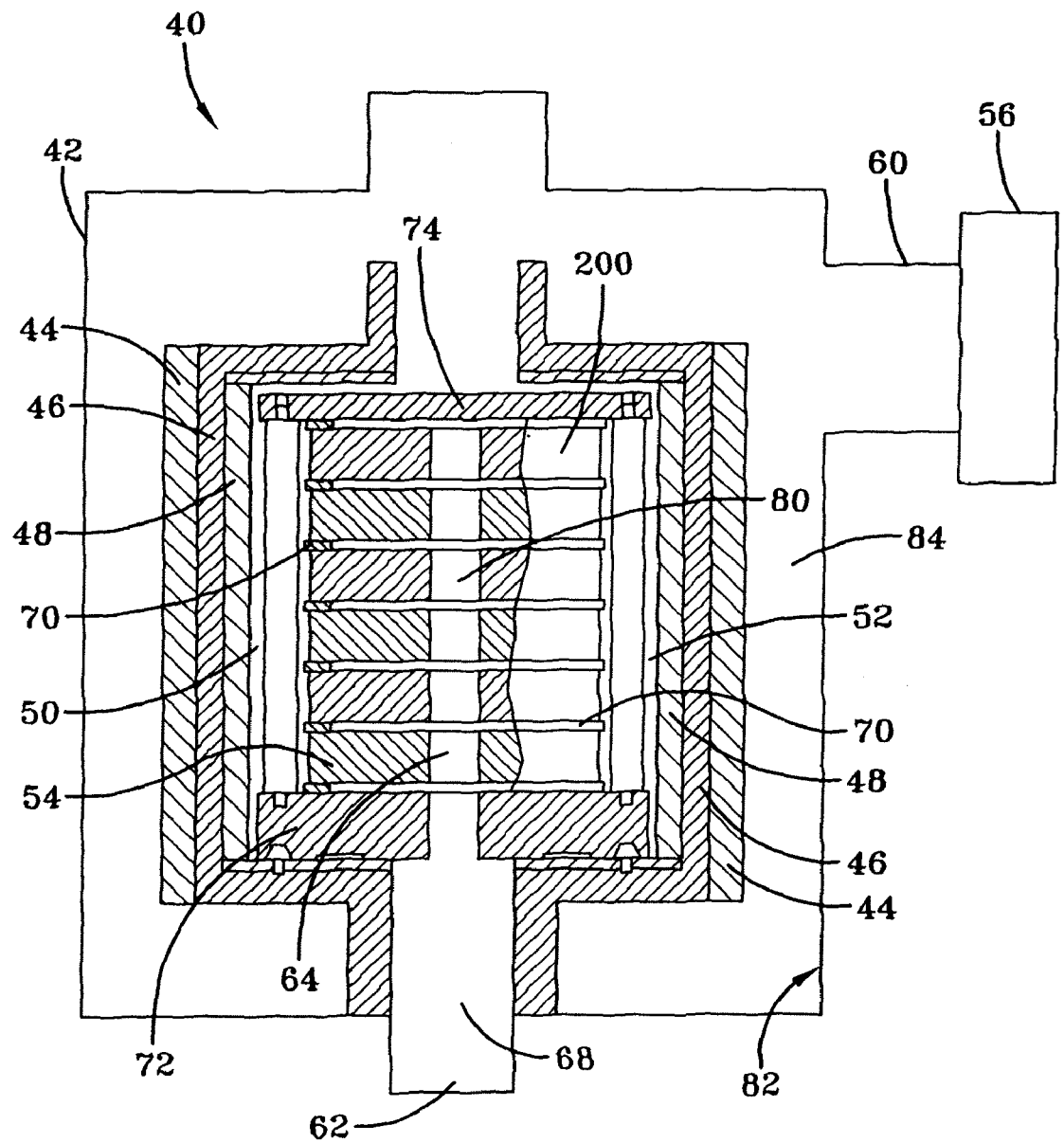
FIG. 1 shows a sectional view of a CVI/CVD furnace.

The invention is described with reference to the drawings in which like elements are referred to by like numerals. The relationship and functioning of the various elements of this invention are better understood by the following description. Each aspect so defined may be combined with any other aspect or aspects unless clearly indicated to the contrary. The embodiments as described below are by way of example only, and the invention is not limited to the embodiments illustrated in the drawings.

The invention and various embodiments thereof are presented in FIGS. 1 through 9 and the accompanying descriptions wherein like numbered items are identical. As used herein, the term "conventional isothermal CVI/CVD" is intended to refer to the previously described isothermal CVI/CVD process. The term "pressure gradient CVI/CVD" is intended to refer to the previously described pressure gradient CVI/CVD or forced-flow process and is intended to specifically exclude the previously described thermal gradient and thermal gradient-forced flow processes to the extent that these processes utilize an intentionally induced thermal gradient that affects the deposition process. The term "single cycle" refers to a process that is capable of densifying porous structures from a starting density to a desired product density in one pressure gradient CVI/CVD process cycle without the need for machining or rearranging the porous structures during the pressure gradient CVI/CVD process.

The goal of the densification process is to produce parts with predominantly rough laminar microstructure of the deposited carbon matrix, low open and closed porosity, and minimal density gradients throughout the part. Depending on the process conditions in a CVI/CVD process, the deposited matrix can form different types of carbon microstructure, including rough laminar, smooth laminar, dark laminar, and isotropic. Rough laminar microstructure has the highest density and thermal conductivity, and the least amount of closed-off porosity (porosity that is unavailable for further matrix deposition via a CVI/CVD process.) Smooth laminar microstructure has lower density and thermal conductivity, and is harder than rough laminar. Isotropic carbon microstructure has the least desirable properties for use as a friction material. Dark laminar microstructure has properties between smooth laminar and isotropic microstructure. (For further discussion of the types of carbon microstructure, see H. O. Pierson and M. L. Lieberman, CARBON, Volume 13, 1975, pp. 159-166). A rough laminar carbon microstructure of the CVI deposited matrix is preferred because of the desirable friction and thermal characteristics of this microstructure. However, under certain process conditions, smooth laminar, dark laminar, and/or isotropic carbon microstructures may form instead. When making carbon-carbon composite friction materials, e.g. carbon composite brake disks, smooth and dark laminar and isotropic carbon microstructures within the CVI deposited matrix are generally undesirable because brake friction material disk performance is reduced unless the outer surfaces containing the undesirable microstructures are machined off in subsequent operations. However, if the undesirable microstructures of the carbon matrix are deposited in the interior of the disk, the undesirable microstructures cannot be removed and the product may have unacceptable properties. Thus, the challenge is to produce parts quickly, but with a desirable microstructure and other physical properties.

It has been found that by controlling process parameters such as the vessel pressure, temperature, and gas reactivity during a pressure gradient CVI/CVD densification process, porous structures may be densified in shorter time than previous processes, and in a single cycle. In particular, it has been found that by maintaining a high vessel pressure and decreasing the amount of highly reactive gas during the densification process, the porous structures are densified surprisingly quickly. The resulting densified structures have acceptable properties including density, porosity, and a matrix deposit with a rough laminar microstructure. The resulting densified structures also have more uniform density gradients than parts produced by previous processes. The apparatus used in the present CVI/CVD process may be the same as that disclosed in U.S. Patent Publication 2005/0178327.

Referring now to FIG. 1, a schematic depiction is presented of a CVI/CVD furnace 40 adapted to deposit a matrix within a porous structure 54 by a pressure gradient CVI/CVD process according to an aspect of the invention. The furnace 40 has a shell 42 with an inner surface 82 that defines a furnace volume 84, and a gas inlet 62 for introducing a gas into the furnace 40. A preheater (not shown) may be used to raise the temperature of the reactant gas prior to contact of the reactant gas with the porous structures. A susceptor 48 is disposed around the reactor or outer volume 50 and is induction heated by an induction coil 44 according to methods well known in the art. Although a susceptor is described herein, other methods of heating may also be used, such as resistance heating and microwave heating, any of which are considered to fall within the purview of the invention. An insulation barrier 46 is disposed between the susceptor 48 and the induction coil 44. The susceptor 48 has an inner surface 52 that defines an outer volume 50 which is included within the furnace volume 84. The porous structures 54 are disposed within a fixture 200 in the outer volume 50. A vacuum apparatus 56 comprising a vacuum pump or steam vacuum system is in fluid communication with an exhaust 60 and evacuates the furnace volume 84 to a pressure below atmospheric pressure. A reactant gas is introduced into the enclosed cavity or inner volume 80 through the gas inlet 62 that receives the reactant gas. The reactant gas infiltrates the porous structure 54 where it cracks and deposits a matrix within the porous structure 54. A single type of gas or mixtures of multiple types of gases may be supplied to the gas inlet 62. The gas used for carbon CVI is typically composed of hydrocarbons, such as those found in natural gas, e.g. methane, ethane, propane, and butane. The gas may also be one of the several precursors used for ceramic CVI, such as methyltrichlorosilane.

The porous structures 54 include porous structure apertures 64. A tube 68 is in fluid communication with enclosed cavity 80 and the inlet 62 thereby serving to transfer the reactant gas to enclosed cavity 80. The porous structures 54 are sealed between the plates by ring-like spacers 70. The ring-like spacers 70 are generally disk shaped with flat top and bottom surfaces. The furnace volume 84 and outer volume 50 are reduced to a pressure below atmospheric pressure, and the gas is introduced to the porous structure aperture 64 at a greater pressure than the reactor volume pressure to develop a pressure gradient through the wall of the porous structure 54 and force dispersion of the gas through the wall of the porous structure 54 before being withdrawn from the outer volume 50 and the furnace volume 84 by the vacuum apparatus 56.

Figure 2:
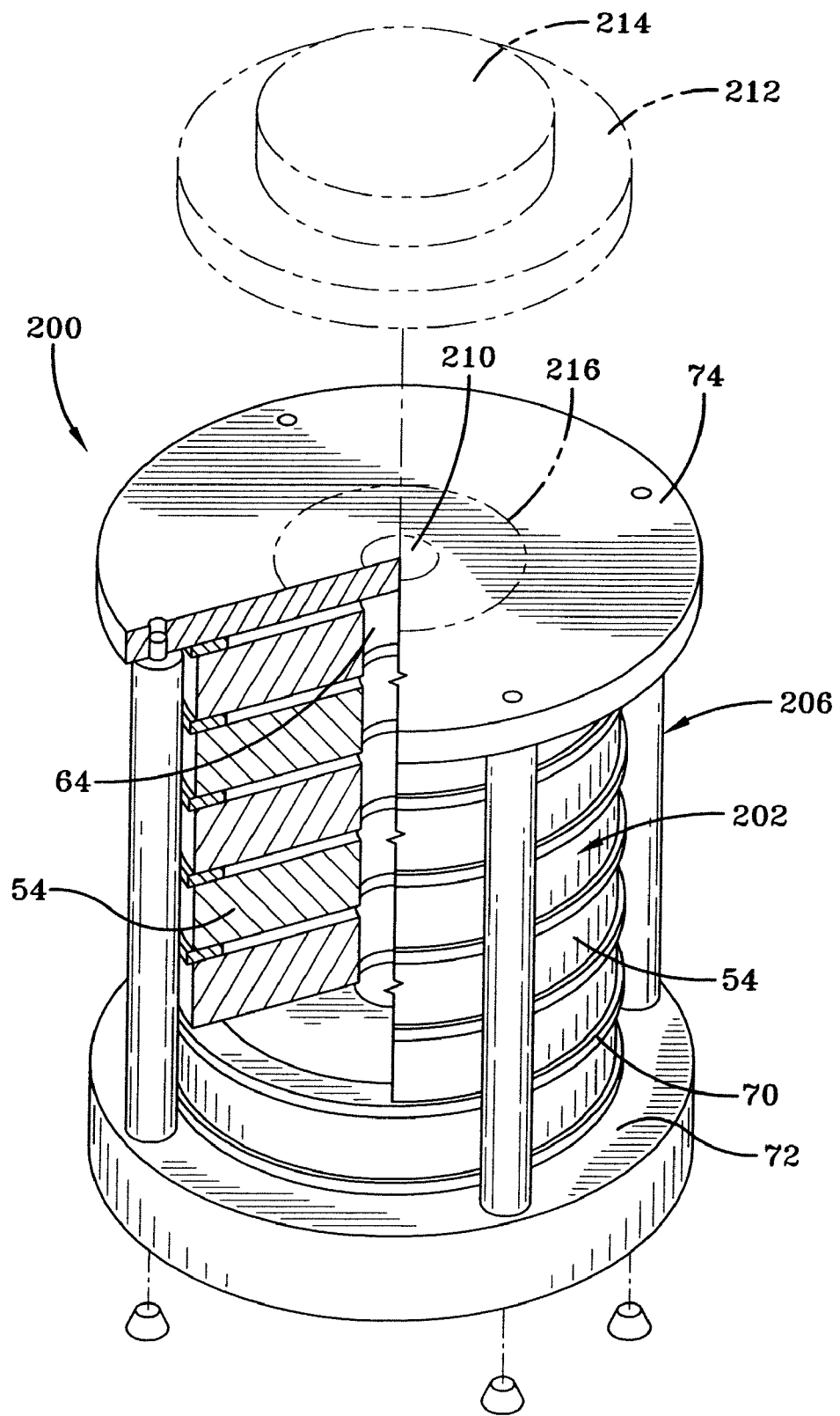
FIG. 2 shows an isometric view of a fixture with a stack of porous structures.

A fixture 200 with the porous structures 54 to be pressure gradient CVI/CVD densified inside a furnace is presented in FIG. 2. The porous structures 54 are arranged in a stack 202. The fixture comprises a bottom plate 72, a spacing structure 206, and a top plate 74. The stack 202 of porous structures 54 is disposed between the bottom plate 72 and the top plate 74. The bottom plate 72, the stack 202 of porous structures 54, and the ring-like spacers 70 define the enclosed cavity 80 extending from the bottom plate 72, including each porous structure aperture 64, and terminating proximate the top plate 74. The top plate 74 optionally has an aperture 210 which is sealed by a cover plate 212 and weight 214. With this option, a cover plate seal 216 is preferably disposed between the cover plate 212 and the top plate 74 and encircles the top plate aperture 210. The cover plate 212 and weight 214 may act as a pressure release device for the enclosed cavity 80. When the pressure gradient between the enclosed cavity 80 and the outer volume 50 reaches a predetermined value, the cover plate 212 is lifted and pressure is released from the enclosed cavity 80. Each porous structure 54 has an aperture 64. The fixture 200 with the porous structures 54 may be disposed within the outer volume 50 of CVI/CVD furnace 40 (FIG. 1).

The various aspects of the present invention may be used to deposit any type of CVI/CVD matrix including, but not limited to, carbon or ceramic matrix deposited within carbon or ceramic based porous structures 54. The invention is particularly useful for depositing a carbon matrix within a carbon-based porous structure, and especially for making carbon/carbon composite structures such as aircraft brake disks. The furnace 40 may be suited for simultaneously densifying large quantities of porous articles, for example five hundred to one thousand annular preforms for manufacturing aircraft brake disks.

A feature of the present invention is that in addition to the reactant gas introduced into enclosed cavity 80, a portion of reactant gas is introduced into the outer volume 50. This process allows for products with a desirable densified structure produced in a single CVI/CVD process cycle. The reactant gas may be introduced into the outer volume 50 by providing channels between the enclosed cavity 80 and the outer volume 50, as described below.

The goal of the densification process is to produce parts with predominantly rough laminar microstructure of the deposited carbon matrix, low open and closed porosity, and minimal density gradients. A rough laminar carbon microstructure of the CVI deposited matrix is preferred because of the friction and thermal characteristics of this microstructure. To produce parts with these desirable properties, in one embodiment the gas is introduced into the enclosed cavity 80 to provide an initial enclosed cavity or stack pressure. One or more channels are provided for fluid communication between the enclosed cavity 80 and the outer volume 50. The channels (such as slots 702) may be provided in ring-like spacers 70 between the porous structures 54 (as shown, for example, in FIG. 5). The pressure in the outer volume 50 (or vessel pressure) is maintained at an initial pressure of at least about 15 torr to provide an initial pressure gradient through the porous structures 54. The pressure gradient between the gas in the enclosed cavity 80 and the outer volume 50 forces the reactant gas through the porous structures and through the channels between the enclosed cavity 80 and the outer volume 50.

The vessel pressure is controlled so that the gas composition in the outer volume 50 has an initial vessel pressure at the start of the densification process. As the enclosed cavity pressure increases due to the densification of parts, the vessel pressure is decreased. Decreasing the vessel pressure limits the maximum enclosed cavity pressure and may minimize the generation of smooth laminar microstructure within the deposited carbon matrix. The vessel pressure may be controlled by releasing pressure through the top of the furnace 40. For example, a valve may be adjusted to control the vacuum at the outlet of the furnace 40. The initial vessel pressure may be between 15 torr and 30 torr, preferably between 20 torr and 25 torr. The vessel pressure may be maintained at greater than 15 torr, 16 torr, or 17 torr. The decrease in vessel pressure preferably occurs after about 100-300 hours on gas (the total time that the porous structures are exposed to the reactant gas composition, hereinafter abbreviated as "HOG"), or when the density of the porous structures is about 1.2 to 1.4 g/cm$^3$. The vessel pressure may be decreased by as little as 1-3 torr. Alternatively, the vessel pressure may be decreased during the densification process to as low as about 10 torr to 20 torr, preferably to between about 12 torr and about 16 torr. The second vessel pressure may be between 1 torr to about 10 torr less than the initial vessel pressure. The vessel pressure may be decreased in a continuous or step-wise fashion. For example, the vessel pressure may be decreased in increments of 0.5 torr or 1 torr at time intervals of 10-25 HOG.

The pressure gradient between the enclosed cavity 80 and the outer volume 50 preferably starts at an initial pressure gradient and increases during the course of the process to a final pressure gradient. The initial pressure gradient may be between 1 torr and 10 torr, and is preferably about 3 torr. In one embodiment, as the densification process proceeds, the pressure gradient is maintained at less than about 25 torr, so that the final pressure gradient is between 2 torr and 15 torr, preferably between 3 torr and 10 torr. In another embodiment, the pressure gradient may be somewhat higher, so that the final pressure gradient is between 5 torr and 25 torr, preferably between 10 torr and 20 torr, most preferably between 10 torr and 15 torr. The types and number of bypass rings (described below) used in the stack influences the pressure gradient between the enclosed cavity pressure and the vessel pressure. The more bypass area provided by the ring-like spacers, the smaller the pressure gradient. Additionally, the process conditions may be controlled so that if the pressure gradient reaches a predetermined maximum value, the gas in the enclosed cavity is vented to limit the enclosed cavity pressure and thus the pressure gradient.

The pressure in the enclosed cavity may only be indirectly controlled by controlling the flow rate of gas into the furnace and controlling the vessel pressure. The feed gas composition has an initial pressure at the start of the densification process. The initial enclosed cavity pressure is between about 20 torr and about 35 torr, preferably between 20 torr and 30 torr, most preferably between 25 and 30 torr. During the course of the densification process, the pressure of the gas in the enclosed cavity increases to a second pressure. Although the general trend of the enclosed cavity pressure is to increase due to increasing resistance to gas flow due to matrix deposition on and within the porous structures, it may also decrease somewhat during the densification process due to the decrease in the vessel pressure, generally by no more than 1-3 torr. The enclosed cavity pressure at the end of the densification process is generally between about 22 torr and about 35 torr. The enclosed cavity pressure may increase up to about 5 to 15 torr greater than the initial enclosed cavity pressure. The increase may be as small as about 2 torr. The maximum enclosed cavity pressure during the course of the densification process is preferably less than about 40 torr, and may be less than 35 torr or 30 torr.

In one embodiment, the gas reactivity is changed through the course of the densification process. The gas reactivity (or amount of highly reactive gas, as explained below) is reduced to maintain the formation of rough laminar deposits and minimize the formation of smooth laminar deposits in the deposited matrix, while providing a maximum densification rate. It has been found that reducing the gas reactivity also enhances the infiltration of the gas so that carbon deposition continues within the porous structure, rather than depositing primarily on the surface of the porous structure. The way in which the gas reactivity is reduced may be adjusted based on the properties of the porous structure, including thickness, porosity, and fiber volume. The decrease in gas reactivity may be combined with the previously described decrease in vessel pressure. Alternatively, in one embodiment, the process includes a decrease in the vessel pressure or the gas reactivity, but not necessarily both.

In one embodiment, the gas composition includes natural gas. Natural gas is predominantly methane but also includes ethane and propane. Additional ethane and propane may be added to the natural gas to provide the appropriate gas reactivity. The ethane and propane, as well as other gases such as butane and alkenes, will essentially entirely react to deposit a carbon matrix within the porous structures. Methane is less reactive and only a portion (generally about half) of the methane will react during the process. Thus, as used herein, the term "highly reactive gases" includes ethane, propane and other carbon precursor gases more reactive than methane. At the start of the densification process, the amount of highly reactive gases in the gas composition introduced into the furnace may be between about 10% and about 20%, preferably between about 10% and about 18%, more preferably between about 12% and about 16%. As used herein, the gas percentages are % by volume. The amount of highly reactive gas in the gas composition may be reduced as the CVI/CVD densification process proceeds. The gas composition introduced into the furnace toward the end of the densification process preferably includes between about 5% and about 10% highly reactive gas, preferably between about 7% and about 10% highly reactive gas. In one embodiment, the gas composition introduced into the enclosed cavity includes between 10% and 18% highly reactive gas at the start of the densification process and between 5% and 10% highly reactive gas when the porous structures have an average density of at least about 1.0 g/cm$^3$. In one embodiment, the amount of highly reactive gas is decreased during the process in a gradual fashion to reach a minimum of 7.5% at about 350 HOG, or when the parts have a density of about 1.6 g/cm$^3$.

The pressure gradient CVI/CVD process may be conducted at about 1700-2000° F. In one embodiment, the parts have an average temperature of about 1865° F. at the start of the process. The part temperature may be decreased by about 10° F. during the densification process. The reduction in part temperature may help to minimize the overcoating of carbon on the outside of the porous structures.

The weight of the furnace may be monitored to control the process parameters. The temperature, vessel pressure, and gas reactivity may be controlled as a function of hours on gas or density of the porous structures. The single cycle process preferably takes less than 700 hours on gas, more preferably less than 600 hours on gas, most preferably less than 400 hours on gas.

Figure 4:
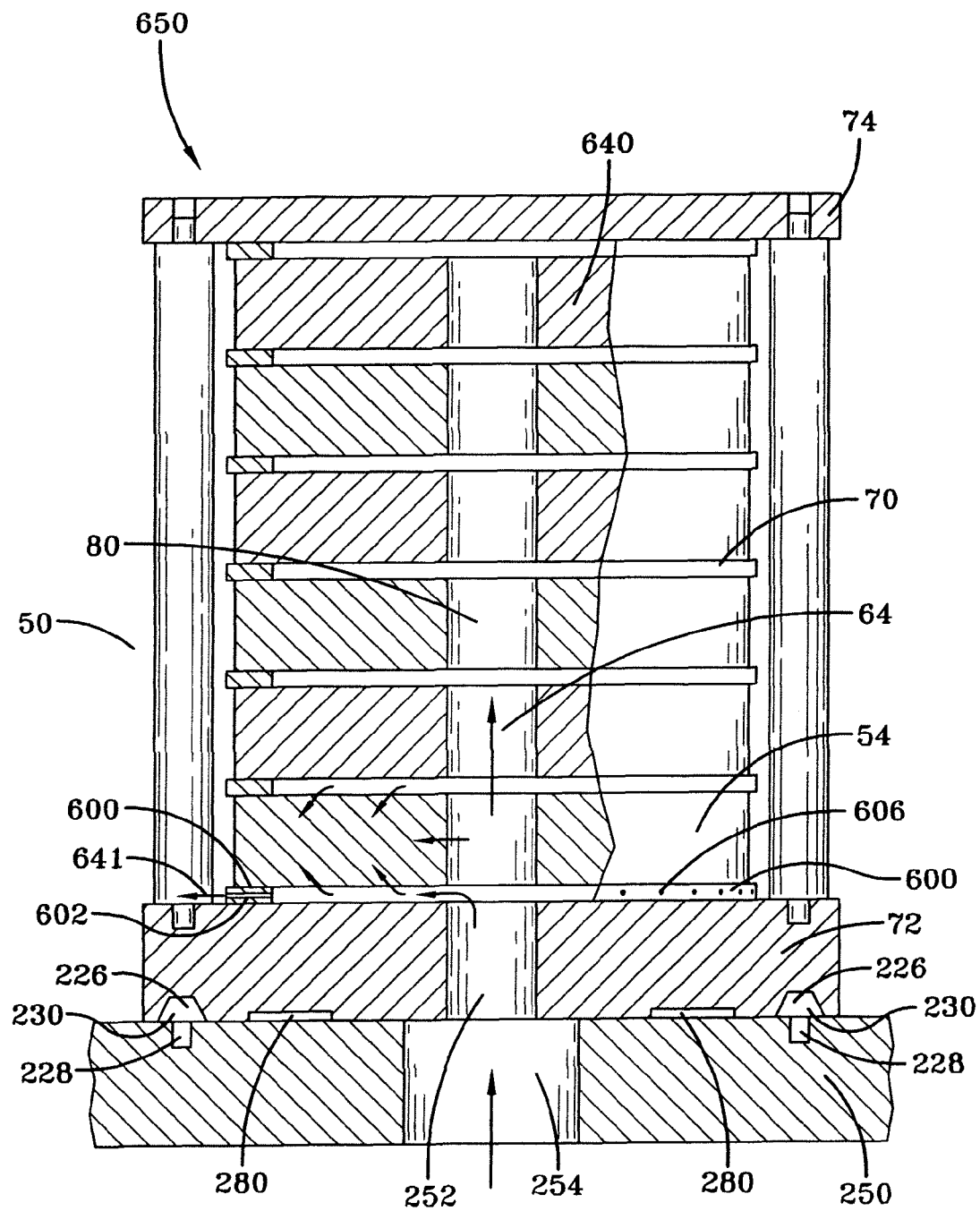
FIG. 4 shows a sectional view of a fixture with a stack of porous structures with a pass-through spacer.

Turning now to a specific embodiment of an apparatus that may be used with the CVI/CVD process, FIG. 4 is a sectional view of a fixture 650. The base plate or bottom plate 72 is adapted to be secured inside the CVI/CVD furnace 40 (FIG. 1) to the furnace floor plate 250. The base plate 72 has a base plate aperture 252 in fluid communication with furnace floor aperture 254. The base plate is preferably located by a plurality of conical pins 226 disposed in mating conical pin holes 228 in furnace floor plate 250. The base plate 72 has mating conical base plate holes 230 that are aligned with and receive the conical pins 226. This arrangement facilitates aligning the base plate aperture 252 with the furnace floor aperture 254.

The base plate 72 is preferably sealed to the furnace floor plate 250, and a compliant gasket 280 may be disposed between the base plate 72 and the furnace floor plate 250 for this purpose. Suitable compliant gaskets may be formed from a flexible graphite such as Grafoil® brand graphite flexible sheet and ribbon pack available from GrafTech International, Cleveland, Ohio U.S.A. and Thermafoil® brand flexible graphite sheet and ribbon-pack available from EGC Enterprises Incorporated, Mentor, Ohio, U.S.A.

Figure 3:
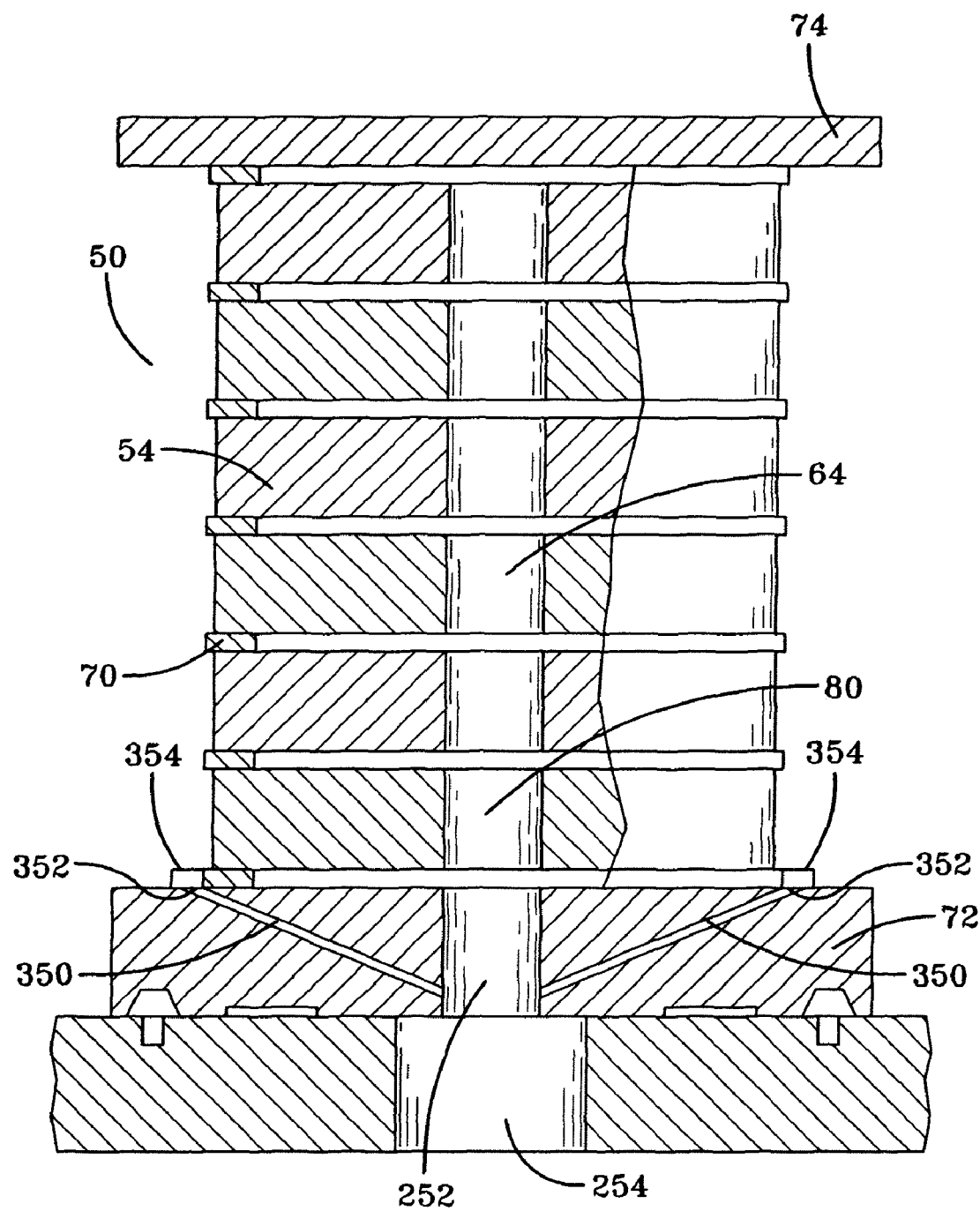
FIG. 3 shows a sectional view of a fixture with a stack of porous structures and bottom pressure release.

FIG. 3 shows an alternative stack configuration. In this configuration, the base plate 72 includes channels 350 that allow fluid communication between the base plate aperture 252 and the outer volume 50. During the course of a run, the gas pressure in enclosed cavity 80 is generally greater than or equal to the gas pressure in outer volume 50. A pressure regulation device 354 at the channel outlet 352 controls the flow of gas from the base plate aperture 252 in the enclosed cavity 80 to the outer volume 50. In one embodiment, the pressure regulation device 354 regulates gas flow from the enclosed cavity 80 through the channels 350 into the outer volume 50. The pressure regulation devices 354 may allow gas to flow through the channels 350 only after the gas pressure in enclosed cavity 80 reaches a certain predetermined pressure gradient. The flow of reactant gas through channels 350 is generally less than 10% of the total reactant gas flowing into the enclosed cavity 80. In one embodiment of the pressure regulation device 354, a pair of channels 350 of 0.25 inches (0.635 cm) in diameter are drilled through the bottom base plate 72, from the base plate aperture 252 to the outer volume 50 outside of the stack. A small graphite disk lined with Grafoil® is positioned over each of the channel outlets 352. Guide pins encircle each hole to keep the graphite disk centered over each hole. Thus, when a certain pressure gradient is reached between enclosed cavity 80 and outer volume 50, gas is vented from the base plate aperture 252 to the outer volume 50. In an alternative embodiment, the pressure regulation devices 354 are not used and gas is allowed to flow through channels 350 during the course of the entire run.

In the embodiment depicted in FIG. 3, the spacers 70 do not include channels or holes for fluid communication between the porous structure aperture 64 and the outer volume 50. However, the spacers 70 may be replaced with alternative spacer designs 600 and 700, as shown in FIGS. 6 and 7 and described below. The channels 350 may be used in conjunction with, or in the place of, the pass through spaces such as those shown in FIGS. 6 and 7. By controlling the size and number of channels 350, the channels 350 may be used to control the flow of the gas composition between the enclosed cavity 80 and the outer volume 50, in order to optimize the densification of the porous structures.

Figure 6A:
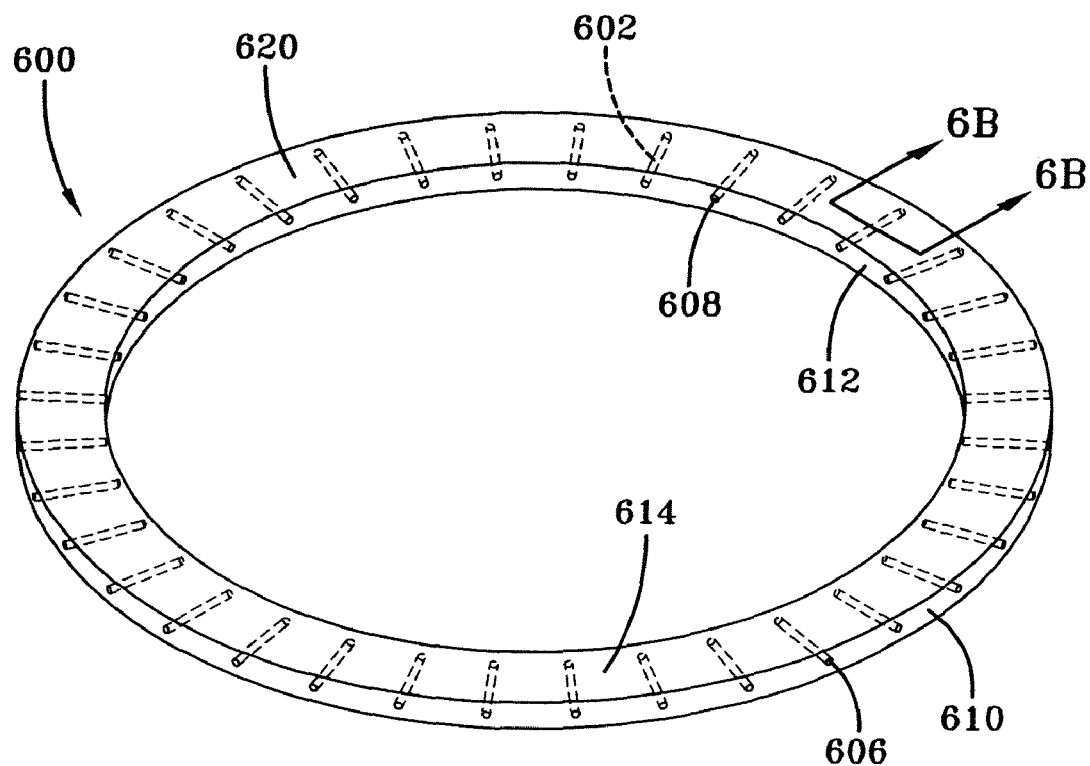
FIG. 6A shows an isometric view of a pass-through spacer with channels.
Figure 6B:
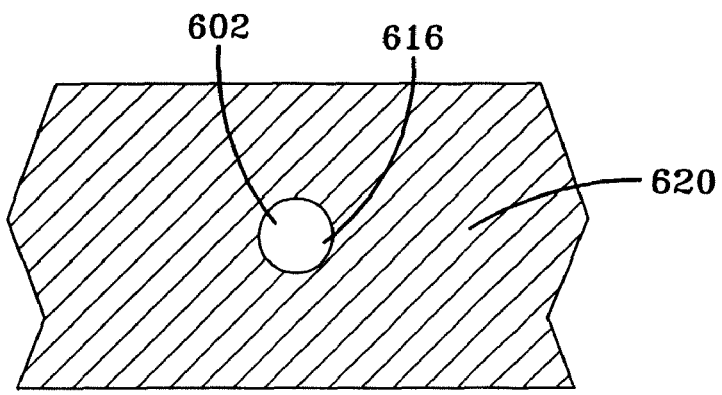
FIG. 6B shows a sectional view of a pass-through spacer with channels.

FIG. 6 shows a pass-through spacer design 600. The spacer is ring shaped, with a flat top surface 614 and flat bottom surface. The spacer 600 has an outer surface 610 and an inner surface 612. Running through the body 620 of the spacer are a series of channels 602. The channels 602 connect openings 606 in the outer surface 610 and openings 608 in the inner surface 612, allowing fluid communication between the areas adjacent the outer openings 606 and the inner openings 608. In one embodiment, the spacer includes 36 channels arranged every 10° around the spacer. However, it will be apparent to those skilled the art that other hole arrangements are possible. FIG. 6B shows a cross sectional view along line 6B-6B of FIG. 6. The channel 602 is positioned in the spacer body 620 and has a cross-sectional area 616. The channels 602 are shown as circular channels, but it will be apparent to those skilled in the art that other channel geometries are possible.

The pass-through spacer may be manufactured by drilling a series of holes through a spacer of appropriate and desired dimensions. The purpose of pass-through spacer 600 is to allow a portion of the unreacted gas to pass from the inner volume to the reactor volume. This allows densification of the outer diameter section of the porous structure, which overall allows densification of the porous structures in a single cycle.

Figure 7A:
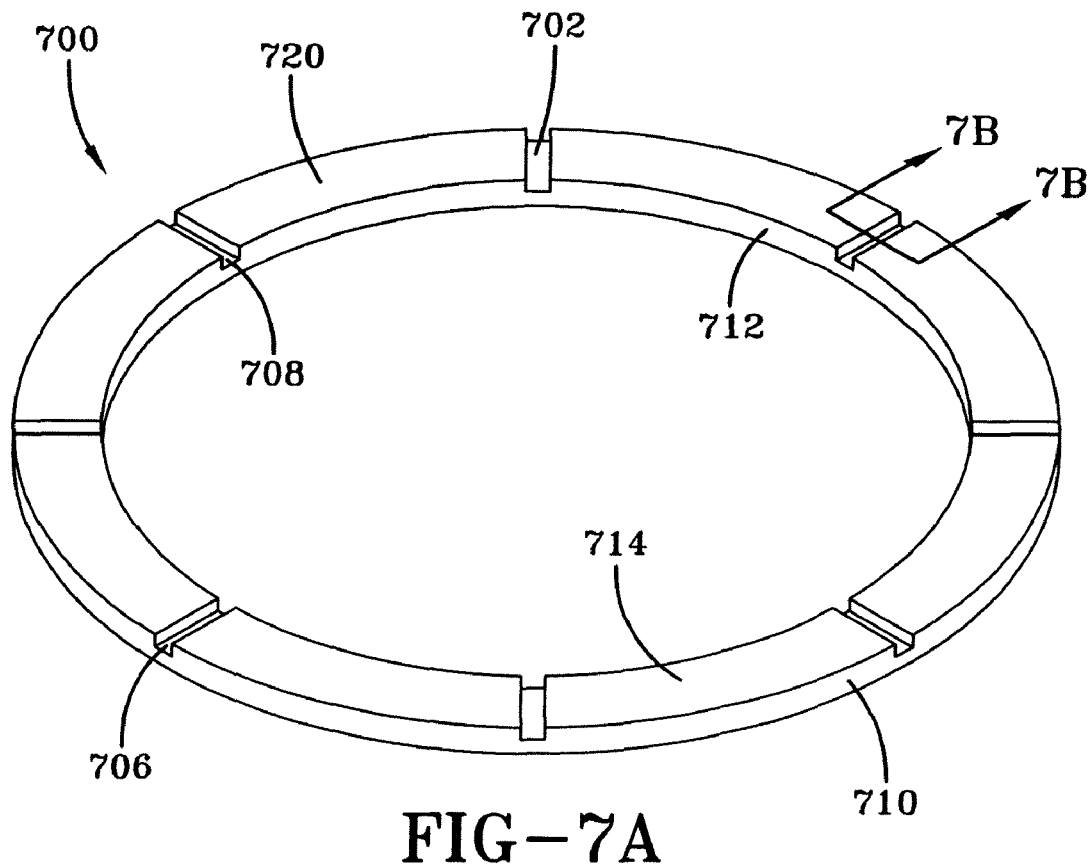
FIG. 7A shows an isometric view of a pass-through spacer with slots.
Figure 7B:
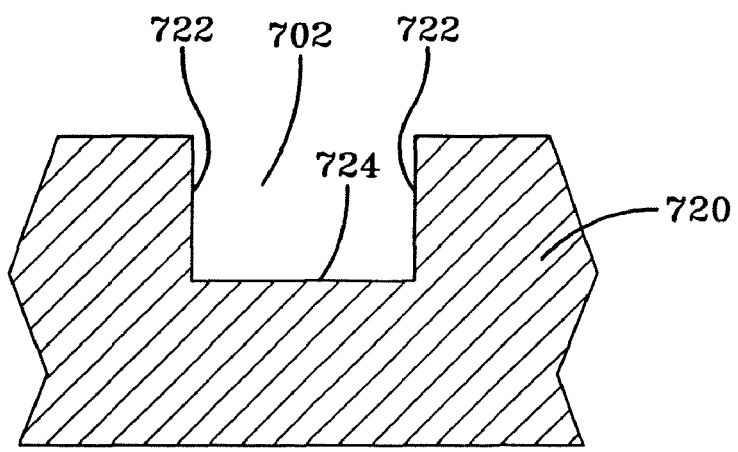
FIG. 7B shows a sectional view of a pass-through spacer with slots.

FIG. 7 shows an alternative pass-through spacer design 700 of the present invention. The spacer is ring shaped, with a flat top surface 714 and flat bottom surface. The spacer 700 has an outer surface 710 and an inner surface 712. The top surface 714 has a series of slots 702 positioned in the spacer body 720. FIG. 7B shows a cross sectional view along line 7B-7B of FIG. 7. The slots 702 have a bottom 724 and two sides 722. The slots 702 connect the outer surface 710 and the inner surface 712, allowing fluid communication between the areas adjacent the outer slot end 706 and the inner slot end 708. In one embodiment, the spacer includes eight slots 702 arranged equidistantly around the spacer. However, it will be apparent to those skilled the art that other hole arrangements are possible. The slots 702 are shown as rectangular in cross section, but the geometry of the slots themselves is not believed to be important. It will be apparent to those skilled in the art that other geometries are possible, such as channels with round, oval, or triangular cross-sections.

According to a certain embodiment, the outside diameter of the spacers 600 and 700 is about 21.9 inches and the spacer inside diameter is about 19.9 inches for processing annular porous structures 54 having an outside diameter of about 21 inches. The ring-like spacers are preferably at least 0.25 inch thick. In one embodiment, the spacers are made from graphite or carbon/carbon material. In one embodiment, the pass-through spacer design 600 depicted in FIG. 6A has 36 equally spaced 0.125 inch diameter radial channels. Each pass-through spacer 600 has a total open area (i.e. area available for gas flow) of 0.44 in$^2$. In another embodiment, the pass-through spacer design 700 depicted in FIG. 7A includes a 0.10-inch deep by 0.125-inch wide slot every 45° around the entire ring, for a total of eight slots per ring. Each pass-through spacer 700 has a total open area of 0.10 in$^2$. For a stack of about 50 porous structures, the total open area provided by the spacers is preferably between 0.5 in$^2$ and 6.0 in$^2$. Other possible holes sizes and number of channels or slots are possible, and may be varied depending on the stack configuration and process operating conditions. The gas flow rate for a stack of about 50 porous structures may range between 300 standard cubic ft/hr (scfh) and 600 scfh, or between 6 and 12 scfh per porous structure. At a CVI/CVD temperature of 1865° F., outer volume pressure of 10 torr, and gas flow rate of 300 scfh, 6.0 in$^2$ open area per stack provides an initial pressure differential of about 1 torr. At a CVI/CVD temperature of 1865° F. and pressure of 10 torr, and gas flow rate of 900 scfh, 6.0 in$^2$ open area per stack provides an initial pressure differential of 27 torr.

Turning to FIG. 2, if the porous structures 54 are compliant, the neighboring porous structures may be pressed against the spacer 70 which slightly deforms the porous structure and develops a seal. The porous structures 54 are preforms composed of carbon fibers. These preforms generally have an initial bulk density of about 0.35 to 0.55 g/cm$^3$ and about 20-30% fiber volume. Pressing the adjacent porous structures 54 against the ring-like spacer 70 seals each porous structure 54 against the ring-like spacer 70 which prevents the gas from leaking into the reactor volume without passing through the porous structure 54. According to a preferred embodiment, the ring-like spacer 70 is machined from graphite or a graphite-like material. This eliminates the need for gaskets between the spacer 70 and the porous structures 54 and greatly simplifies stack assembly. If the porous structures 54 are not compliant (already partially densified with deposited matrix, for example), merely pressing the porous structures 54 against the ring-like spacer 70 does not produce a sufficient seal. Therefore, in an alternative embodiment, at least one ring-like compliant gasket (not shown) is disposed adjacent each spacer 70 side, and each compliant gasket is pressed against the neighboring porous structure 54, which deforms the compliant gaskets against the ring-like spacer 70 to form a seal.

FIG. 4 depicts a fixture 650 with stack configuration 640. Stack configuration 640 includes a pass-through spacer 600 positioned between the base plate 72 and a porous structure 54. Standard ring-like spacers 70 are positioned between the other porous structures 54. The pass-through spacer 600 is of the design depicted in FIG. 6. The pass-through spacer 600 includes a plurality of openings 606. Channels 602 provide fluid communication between the enclosed cavity 80 and the outer volume 50. Gas flows from the base plate aperture 252, through channel 632, and into outer volume 50, as shown by arrows 640. In normal operation, the gas flow will not be so large as to eliminate the pressure gradient between enclosed cavity 80 and outer volume 50. Although the embodiment shown FIG. 4 only includes one pass-through spacer 600, other configurations are possible, including positioning the pass though spacer 600 at other locations along the stack height and providing more than one pass-through spacer 600. The pass-through spacer configuration of FIG. 4 could also be combined with the bottom pressure release configuration of FIG. 3. Additionally, pass-through spacers of design 700 could be combined with the configuration shown in FIG. 4.

Figure 5:
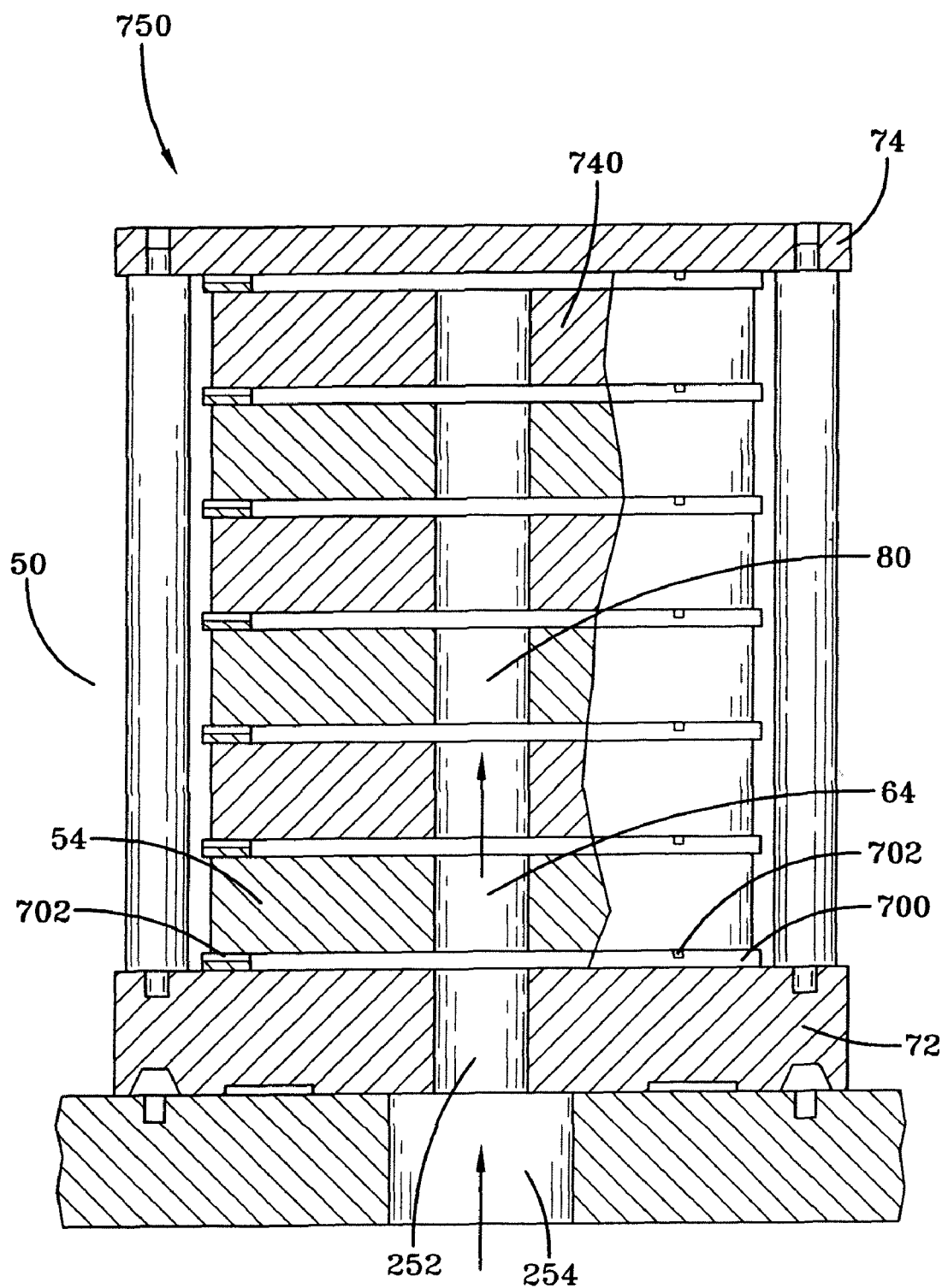
FIG. 5 shows a sectional view of a fixture with a stack of porous structures with pass-through spacers.

FIG. 5 depicts fixture 750 with stack configuration 740. The stack configuration 740 includes pass-through spacers 700 positioned between the base plate 72 and a porous structure 54, and between porous structures 54. The pass-through spacer 700 is of the design depicted in FIG. 7. The pass-through spacer 700 includes a plurality of slots 702. The slots 702 provide fluid communication between the enclosed cavity 80 and the outer volume 50. Gas flows from the enclosed cavity 80, through slot 702, and into outer volume 50. In normal operation, the opening size of the slots 702 will not be so great as to eliminate the pressure gradient between enclosed cavity 80 and outer volume 50. Although the embodiment shown FIG. 5 includes pass-through spacers 700 between all adjacent porous structures 54, other configurations are possible, including positioning the pass-though spacer 700 at only some locations along the stack height and providing standard spacers 70 at the other positions. The pass-through spacer configuration of FIG. 5 could be used at some or all positions between porous structures along the stack in combination with the bottom pressure release configuration of FIG. 3.

Figure 8:
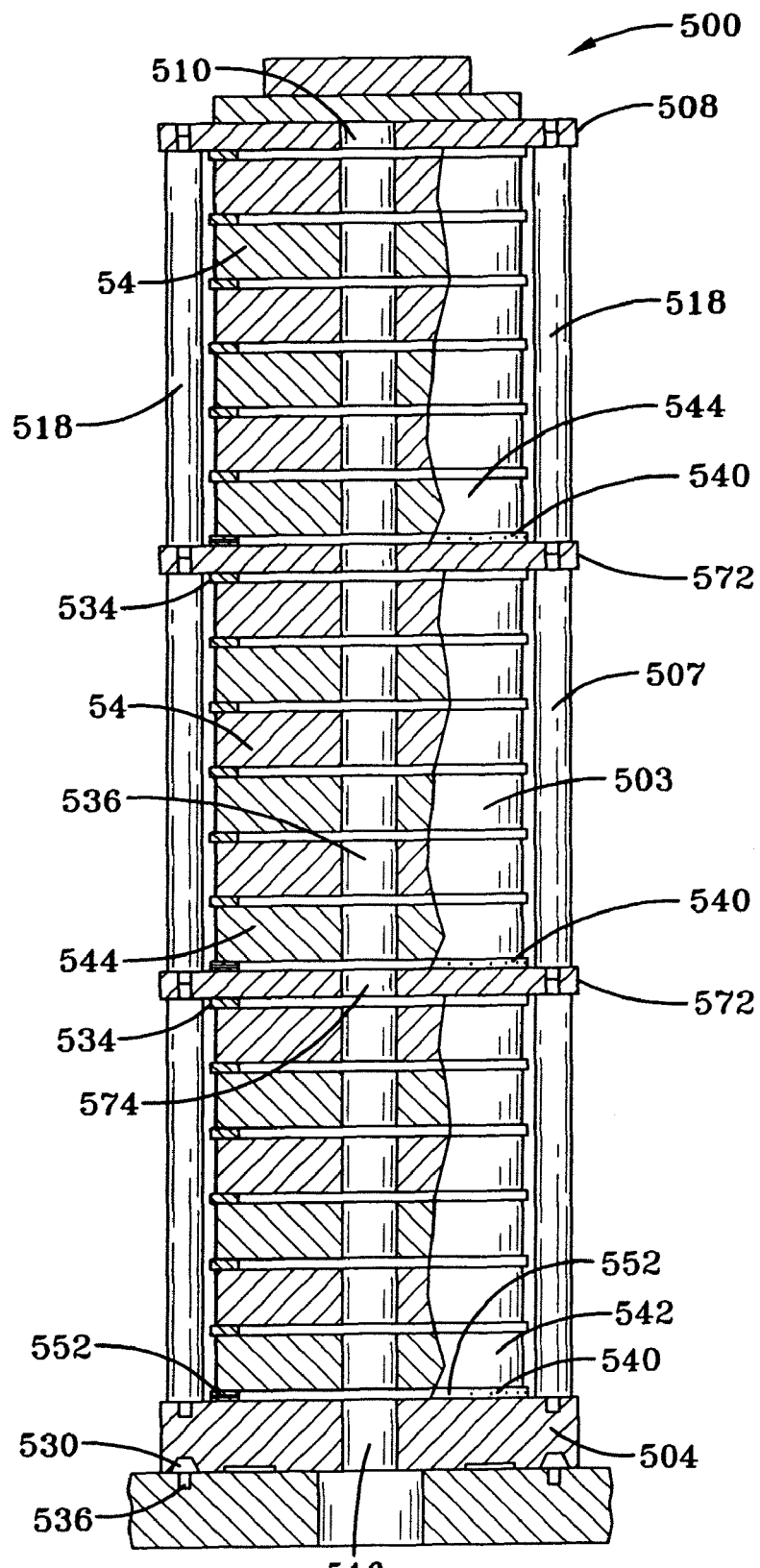
FIG. 8 shows a sectional view of a fixture with a stack of porous structures.

Referring to FIG. 8, a preferred fixture 500 is presented for pressure gradient CVI/CVD densifying simultaneously a large number of porous structures 54. The spacing structure 507 comprises at least one intermediate plate 572 disposed between the base plate 504 and the top plate 508 that divides the stack of porous structures 503. The posts 518 extend between the top plate 508 and one of the intermediate plates 572, between the base plate 504 and another of the intermediate plates 572, and between adjacent pairs of intermediate plates 572. In other respects, fixture 500 is essentially identical to fixture 650. The stack configuration includes pass-through spacers 540 positioned between the base plate 504 and a porous structure 542, and between the intermediate plates 572 and the porous structures 544 above the intermediate plates 572. Standard spacers 70 are positioned between the other porous structures 54. The pass-through spacer 540 is of the design 600 depicted in FIG. 6, which includes a plurality of holes 552.

Still referring to FIG. 8, each intermediate plate 572 has an intermediate plate aperture 574 therethrough. The enclosed cavity 536 further includes each intermediate plate aperture 574. At least one of the ring-like spacers 534 is disposed on either side of and sealed to the intermediate plate 572 between the intermediate plate 572 and the porous structures 54. Multiple fixtures 500 may be stacked. In such case, the base plate 504 from one fixture 500 engages the top plate 508 of a lower fixture 500 with the upper fixture base plate aperture 516 in fluid communication with the lower fixture top plate aperture 510. Thus, the enclosed cavity extends from one fixture 500 to the next until being terminated by the cover plate 512 disposed over the uppermost top plate aperture 510.

Although the embodiment shown FIG. 8 includes pass-through spacers 540 only above the base plate 504 and the intermediate plates 572, it will be apparent to those skilled in the art that other configurations are possible, including positioning pass though spacer 540 at other locations along the stack height. The pass-through spacers 540 could also be replaced with a spacer of the alternative design 700.

Figure 9:
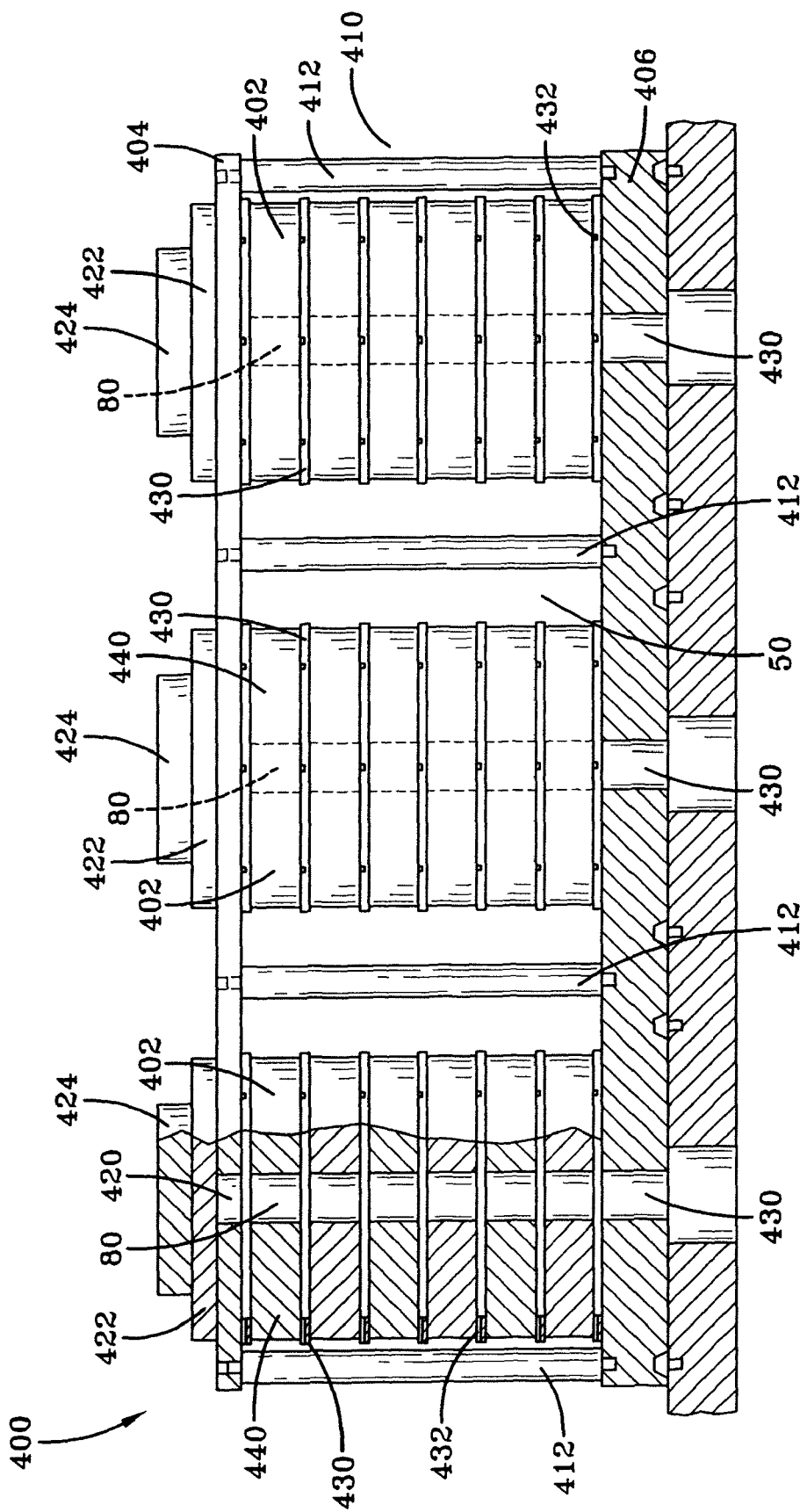
FIG. 9 shows a sectional view of a fixture with multiple stacks of porous structures.

FIG. 9 presents a fixture 400 whereby first and second or more stacks of porous structures may be disposed laterally adjacent each other. A plurality of adjacent stacks 402 of porous structures 440 are disposed between a top plate 404 and a base plate 406 along with a spacing structure 410. A spacing structure 410 comprises a multitude of posts 412. A top plate 404 optionally has a top plate aperture 420 for each stack 402 that may be sealed by cover plates 422 and weights 424. A base plate has a base plate aperture 430 for each stack 402. In other respects, fixture 400 is similar to fixture 750. The stacks 402 include pass-through spacers 430 positioned between the base plate 406 and porous structures 440, and between adjacent porous structures 440. The pass-through spacer is of the design 700 depicted in FIG. 7. The pass-through spacer 430 includes a plurality of slots 432. The slots 432 provide fluid communication between the inner volumes 80 and the outer volume 50.

Although the embodiment shown FIG. 9 includes pass-through spacers 430 between all adjacent porous structures 440, other configurations are possible, including positioning the pass-though spacer 430 at only some locations along the stack height and providing standard spacers 70 at the other positions. The pass-through spacer configuration of FIG. 9 could also be combined with the bottom pressure release configuration of FIG. 3. These other combinations are intended to be encompassed within the scope of the present invention.

In addition, spacing structure 410 may comprise intermediate plates that divide the stacks 402, and multiple fixtures 400 may be stacked one on top of another as described in relation to fixture 500 of FIG. 8. Thus, the features of fixtures 400 and 500 may thus be combined as necessary to enable pressure gradient densification of a very large number of porous structures 54.

According to a preferred embodiment, a multitude of annular porous carbon structures 54 are disposed within a CVI/CVD furnace such as furnace 40 (FIG. 1) using multiple fixtures such as fixture 500 (FIG. 8) or fixture 400 (FIG. 9). The enclosed cavity of each fixture may be partially sealed by the ring-like spacers 70 sealing adjacent porous structures 54 to prevent gas from leaking from the enclosed cavity 80 into the outer volume 50. However, pass through spacers 600 or 700 may be placed at a plurality of locations between porous structures 54 to allow controlled flow of reactant gas from the enclosed cavity 80 to the outer volume 50. The type, number, and location of the pass-through spacers are chosen in order to optimize the densification of the porous structures 54 to the desired product properties. A plurality of control valves and flow meters is used to control the flow of reactant gas to the furnace 40. The reactant gas flows though one or more preheaters, which raise the temperature of the reactant gas. A susceptor, such as susceptor 48 in FIG. 1, heats the porous structures.

A reactant gas is supplied to the enclosed cavity 80 of each fixture. A portion of reactant gas is introduced into the outer volume 50. This reactant gas may be introduced into the outer volume through channels 350 in the base plate (FIG. 3), through the channels in pass-through spacer designs 600 and 700, through other means, or through some combination of the above. Temperature sensors measure the temperatures inside the porous structure apertures and the temperatures of the porous structures. The temperature and pressure conditions are chosen to cause the gas to deposit a matrix having certain desired properties within the porous structure. As previously described, the part temperature, vessel pressure, and gas reactivity may be controlled to provide optimum densification of the porous structures.

A carbon matrix is deposited within the porous structures by the pressure gradient CVI/CVD process. The porous structures may be subjected to heat treatment at about 3000-4000° F., if desired. The heat treatment may occur in the middle of the pressure gradient CVI/CVD process or after the pressure gradient CVI/CVD process is completed. The heat treatment step may also be skipped. The heat treatment process is conducted at a higher temperature than the previous deposition process temperatures which increases graphitization of the first carbon matrix.

Following the pressure gradient CVI/CVD process, the porous structures are removed from the furnace and surface machined in order to derive an accurate bulk density measurement. The densified structures are machined into final parts. In the present invention, there is no need for multiple CVI/CVD densification steps or for intermediate machining or rearranging the structures during the CVI/CVD densification process.

Additional steps may be taken in order to ensure maximum efficiency of the process. Spacers may be either CVD coated or graphite paint coated to prevent hard bonding of spacer surfaces to the part surfaces. Spacer blocks are small structures of similar material to the spacers and are used to help support the positioning of the porous structures. Spacers and spacer blocks are designed near optimum dimensions, enough to provide adequate sealing and minimize surface coverage, to prevent low density regions in the porous structure directly below the spacer. To minimize the adverse effect of spacer indentation into the wear faces, spacer dimensions are such that the planned ID and OD surface machining of the part would remove most of these spacer contact areas.

The various components of fixtures 200, 400, 500, 650, and 750 are preferably formed from graphite, but any suitable high temperature resistant material may be used in the practice of the invention. In one embodiment, the spacers and spacer blocks are made from a flexible, compressible graphite-like foil material known as Grafoil®. The Grafoil® material prevents the spacers and spacer blocks from CVD bonding to the part wear surfaces (and therefore causing these areas of the part to be peeled off upon spacer removal) and minimize indentation as well. The Grafoil® spacers and spacer blocks are easily separated from the parts upon load break-down, leaving the part surfaces intact.

The various joints may be sealed using compliant gaskets and/or liquid adhesives such as a graphite cement. The porous structures may be pressed against the ring-like spacers to form appropriate seals if the porous structures are compliant before densification. Suitable compliant gaskets may be formed from a flexible graphite such as Grafoil® brand graphite flexible sheet and ribbon pack available from GrafTech International, Cleveland, Ohio U.S.A. and Thermafoil® brand flexible graphite sheet and ribbon-pack available from EGC Enterprises Incorporated, Mentor, Ohio, U.S.A.

EXAMPLES

The following examples of the invention and comparative examples are provided by way of explanation and illustration. The examples provide densification processes suitable for the production of brake disks for commercial aircraft, such as the Boeing 747 and the Airbus A330.

For Examples 1-3 and 7-8, fibrous textile structures were manufactured via the needling of oxidized polyacrylonitrile fiber fabrics in various woven and air-laid configurations. For examples 4-6, fibrous textile structures were manufactured according to FIGS. 1 through 4 of U.S. Pat. No. 4,790,052 starting with a 320K tow of unidirectional oxidized polyacrylonitrile fiber. Annular porous structures were then cut from these fibrous textile structures. The annular porous structures were pyrolyzed to transform the fibers to carbon. The pyrolyzed porous structures, having a bulk density of 0.35 to 0.55 g/cc, were then placed in a furnace similar to Furnace 40 of FIG. 1.

Examples 1 and 2

A single cycle densification process was conducted in a furnace with a 20-day total process time for commercial aircraft-size production-type porous structures. The hours on gas were 400.

A first stack of porous structures (Example 1) included leak path, or pass-through, locations between each pair of adjacent porous structures. The porous structures were of a variety of types, with 25%-30% fiber volume, thicknesses from 1.0 to 1.3 inches, outer diameters from 16 to 21 inches, and inner diameters from 9 to 12 inches. The stack included about 55 porous structures. The spacers were of the pass-through spacer design 700 shown in FIG. 7. The spacers 700 included a 0.10-inch deep by 0.125-inch wide slot every 45° around the entire ring, for a total of eight slots per ring. Each ring had a total open area (i.e. area available for gas flow) of 0.10 in$^2$. Thus, the stack was similar to the stack design 750 depicted in FIG. 5

A second stack of porous structures (Example 2) in the same furnace as the first stack included pass-through spacers located at regular intervals up the height of the stack, with four pass-through spacers per stack. The porous structures were of a variety of types, with 25%-30% fiber volume, thicknesses from 1.0 to 1.3 inches, outer diameters from 16 to 21 inches, and inner diameters from 9 to 12 inches. The stack included about 55 porous structures. Each pass-through location consisted of pass-through spacers similar to spacer 600 in FIG. 6A. The spacers were composed of carbon or graphite and included 36 equally spaced ⅛" diameter radial holes. Each ring had a total open area (i.e. area available for gas flow) of 0.44 in$^2$.

The stacks of Examples 1 and 2 were subjected to the same vessel pressure during the course of the densification process and were densified concurrently. The vessel pressure (or pressure in an outer volume) was methodically decreased in 0.5 torr increments starting at about 70 HOG and continuing at intervals of about 15 hours thereafter, until a final vessel pressure of 15 torr was reached at around 200 HOG. The average part temperature for both stacks was about 1855-1875° F.

For Example 1, at the start of the run, the enclosed cavity pressure was 25 torr and the vessel pressure was 19.5 torr, for an initial pressure gradient of 5.5 torr. As the run progressed, the enclosed cavity pressure gradually increased, to a final pressure of 27.5 torr and a final pressure gradient of about 12.5 torr.

For Example 2, at the start of the run, the enclosed cavity pressure was 27 torr, the vessel pressure was 19.5 torr, for an initial pressure gradient of 7.5 torr. As the run progressed, the enclosed cavity pressure gradually increased, to a final pressure of about 30 torr and a final pressure gradient of about 15 torr.

Gas flow was maintained at about 400 standard cubic ft/hr (scfh) per stack of porous structures. The initial gas composition was 16% highly reactive gas (ethane plus propane). The amount of highly reactive gas was decreased throughout the run in a gradual fashion, starting at about 50 HOG, to reach a minimum of 8.5% at about 250 HOG.

Archimedes testing to determine part densities and open porosity revealed desirable densification of the porous structures, in the form of about 1.70 to 1.80 g/cm$^3$ bulk density with 6-11% open porosity. An impervious density of about 1.90 g/cm$^3$ and examination using polarized light microscopy indicated that the deposited microstructure was predominantly rough laminar Impervious density is the density of the actual carbon fiber and deposited matrix in the composite material. This is different from the bulk density, which is just the mass divided by the volume of the composite material. This process effectively densified parts to or near final density in only one uninterrupted CVD run.

Example 3

A single cycle densification process was conducted in a furnace with a 20-day total process time for commercial aircraft-size production-type porous structures. The hours on gas were 400. The porous structures were of a variety of types, with 25%-30% fiber volume, thicknesses from 0.6 to 1.0 inches, outer diameters from 16 to 21 inches, and inner diameters from 9 to 12 inches. The stack included 63 porous structures. The stack of porous structures included four pass-through spacers located at regular intervals up the height of the stack. Each pass-through location consisted of pass-through spacers similar to spacer 600 in FIG. 6A. The spacers were composed of carbon or graphite and included 36 equally spaced ⅛" diameter radial holes. Each ring had a total open area (i.e. area available for gas flow) of 0.44 in$^2$.

At the start of the run, the enclosed cavity pressure was about 25 torr, the vessel pressure was 19.5 torr, for an initial pressure gradient of 5.5 torr. The vessel pressure was methodically decreased in 0.5 torr increments starting at about 80 HOG and continuing at intervals of about 12 hours thereafter, until a final vessel pressure of 14.5 torr was reached at around 200 HOG. As the run progressed, the enclosed cavity pressure gradually increased, to a final pressure of 28.5 torr. The final pressure gradient was about 14 torr. The average part temperature during the process was about 1855-1875° F.

Gas flow was maintained at about 400 scfh per stack of porous structures. The initial gas composition was 16% highly reactive gas (ethane plus propane). The amount of highly reactive gas was decreased throughout the run in a gradual fashion, beginning at 60 HOG, to reach a minimum of 8.5% at about 250 HOG.

The resulting densified porous structures had a bulk density in the range of about 1.74 to 1.82 g/cm$^3$ before machining. This process effectively densified parts to or near final density in only one uninterrupted CVD run.

Examples 4-6

A single cycle densification process was conducted in a furnace with a 32-day total process time for annular porous structures suitable for manufacture of aircraft brake disks. The hours on gas were 660. The porous structures had fiber volumes of 26% to 27%, outer diameters from 16 to 21 inches, and inner diameters from 9 to 12 inches. The thickness of the porous structures used in Example 4 was 1.10 to 1.50 inches, in Example 5, 0.7 to 0.95 inches, and Example 6, 1.05 to 1.3 inches. The stack of Example 4 included 53 porous structures, the stack of Example 5 included 67 porous structures, and stack of Example 6 included 58 porous structures.

Each stack of porous structures included leak path, or pass-through, locations between each pair of adjacent porous structures. The spacers were of the pass-through spacer design 700 shown in FIG. 7. The spacers used in Examples 4 and 6 included 8 slots around the ring, each slot with an open area of 0.0125 in$^2$ for a total of 0.10 in$^2$ open area per ring. The spacers used in Example 5 included 6 slots around the ring, each slot with an open area of 0.0125 in$^2$ for a total of 0.075 in$^2$ open area per ring. The stack of Example 4 totaled 5.3 in$^2$ open area; Example 5, 5.0 in$^2$; and Example 6, 5.8 in$^2$. All three stacks were placed in the same furnace and densified concurrently in a single furnace run.

The vessel pressure was methodically decreased in 0.5 torr increments starting at about 240 HOG and continuing at regular intervals thereafter, until a final vessel pressure of 21.5 torr was reached at around 500 HOG. The average part temperature was about 1855-1870° F. during the first half of the run, and 1840-1855° F. during the second half of the run.

For Example 4, at the start of the run, the enclosed cavity pressure was about 26.5 torr, the vessel pressure was 23.5 torr, for an initial pressure gradient of 3 torr. As the run progressed, the enclosed cavity pressure varied between 26 and 27.5 torr. The final pressure gradient was about 5.5 torr.

For Example 5, at the start of the run, the enclosed cavity pressure was about 27.5 torr, the vessel pressure was 23.5 torr, for an initial pressure gradient of about 4.5 torr. As the run progressed, the enclosed cavity pressure varied between about 27.5 and 29 torr. The final pressure gradient was 7.5 torr.

For Example 6, at the start of the run, the enclosed cavity pressure was about 28.5 torr, the vessel pressure was 23.5 torr, for an initial pressure gradient of about 5 torr. As the run progressed, the enclosed cavity pressure gradually increased, to a final pressure of about 32.5 torr. The final pressure gradient was 11.5 torr.

Gas flow was maintained at about 400 scfh per stack of porous structures. The initial gas composition was 12.5% highly reactive gas (ethane plus propane), with the balance methane. The amount of highly reactive gas was decreased throughout the run in a gradual fashion (starting at 90 HOG) to reach a minimum of 7.5% at about 400 HOG. A heat treatment step at a temperature of 3400° F. was performed at about 285 HOG, when the bulk density of the porous structures was about 1.5 g/cm$^3$.

Archimedes testing to determine part densities and open porosity revealed desirable densification of the porous structures. The brake disks produced in Example 4 had a density range of 1.74 to 1.82 g/cm$^3$, an average density of 1.78 g/cm$^3$, and 4-7% open porosity. The brake disks produced in Example 5 had a density range of 1.72 to 1.84 g/cm$^3$, an average density of 1.79 g/cm$^3$, and 7-11% open porosity. The brake disks produced in Example 6 had a density range of 1.77 to 1.84 g/cm$^3$, an average density of 1.82 g/cm$^3$, and 4-5% open porosity. The range of impervious densities of 1.90 to 1.95 g/cm$^3$ for all the parts, as well as examination using polarized light microscopy, indicated that the deposited microstructure was predominantly rough laminar.

The production time of 32 days was about ⅓ of the production time for the previously existing multi-cycle CVI/CVD process of making the same parts. Furthermore, the parts of Examples 4-6 had lower density gradients than parts produced by the existing multi-cycle CVI/CVD process, including parts processed via the pressure gradient process according to U.S. Pat. No. 5,853,485 and followed by a non-pressure gradient process according to U.S. Pat. No. 6,669,988. The single cycle process effectively densified parts to final density in only one uninterrupted CVD run. The properties of the final brake disks, such as friction performance, wear resistance, and mechanical strength, were equal to or superior to products from the previously existing multi-cycle CVI/CVD process. Additionally, the heat sink wear properties of the disks were the same or better, and the heat sink friction performance met the specified performance criteria for the different energy conditions, including the rejected take-off condition, for disks in both the new condition and worn condition.

Examples 7 and 8

A single cycle densification process was conducted in a furnace with a 30-day total process time for commercial aircraft-size production-type porous structures. The hours on gas were 600. The porous structures for Example 7 had an average thickness of 1.65 inches and the porous structures for Example 8 had an average thickness of 1.06 inches. The stack in Example 7 included about 45 porous structures and the stack in example 8 included 58 porous structures. Each stack of porous structures included leak path, or pass-through, locations between each pair of adjacent parts. The spacers were of the pass-through spacer design 700 shown in FIG. 7. The spacers used included 8 slots around the ring, each slot with an open area of 0.0125 in$^2$ for a total of 0.10 in$^2$ open area per ring. The stack of Example 7 totaled 4.5 in$^2$ open area and Example 8, 5.8 in$^2$ open area. Both stacks were placed in the same furnace and the runs were conducted concurrently.

The vessel pressure was 20 torr at the start of the run and was methodically decreased in 0.5 torr increments starting at about 170 HOG and continuing at regular intervals thereafter, until a final vessel pressure of 13.5 torr was reached at around 480 HOG. The average part temperature was about 1855-1875° F. during the first half of the run, and 1840-1860° F. during the second half of the run.

For Example 7, at the start of the run, the enclosed cavity pressure was about 30 torr and the vessel pressure was about 20 torr, for an initial pressure gradient of 10 torr. As the run progressed, the enclosed cavity pressure gradually increased to a final pressure of about 33 torr. The final pressure gradient was about 20 torr.

For Example 8, at the start of the run, the enclosed cavity pressure was about 26.5 torr and the vessel pressure was about 20 torr, for an initial pressure gradient of 6.5 torr. As the run progressed, the enclosed cavity pressure gradually initially increased to a maximum pressure of about 27.5 torr at about 170 HOG and then decreased to a final pressure of about 26 torr. The final pressure gradient was about 12.5 torr.

Gas flow was maintained at about 575 scfh for the stack of porous structures of Example 7, and about 600 scfh for the stack of porous structures of Example 8. The initial gas composition was 13.5% highly reactive gas (ethane plus propane), with the balance methane. The amount of highly reactive gas was decreased throughout the run in a gradual fashion (starting at 90 HOG) to reach a minimum of 8% at about 330 HOG and a bulk density of 1.60 g/cm$^3$.

The brake disks produced in Example 7 and 8 had average bulk densities of about 1.68 to 1.88 g/cm$^3$, depending on the thickness of the porous structures. The process effectively densified parts to final density in only one uninterrupted CVD run. The properties of the final brake disks, such as friction performance, wear resistance, and mechanical strength, were equal to or superior to products from previously existing multi-cycle CVI/CVD processes. Additionally, the heat sink wear properties of the disks were the same or better, and the heat sink friction performance met the specified performance criteria for the different energy conditions, including the rejected take-off condition, for disks in both the new condition and worn condition.

Examples 9 and 10

Final parts were machined from densified porous structures prepared using the single cycle pressure gradient CVI/CVD process of Example 6 and compared to the same products prepared from a previously existing multi-cycle CVI/CVD process. The previously existing multi-cycle CVI/CVD process used for Comparative Examples A and B included a pressure gradient CVI/CVD densification step (such as that shown in U.S. Pat. No. 5,853,485) followed by one or more non-pressure gradient CVI/CVD densification steps (such as that shown in U.S. Pat. No. 6,669,988). The density distributions of the products were compared. Average density measurements were obtained from rotors from the previously existing multi-cycle CVI/CVD process (Comparative Example A), stators from the previously existing multi-cycle CVI/CVD (Comparative Example B), rotors from the present single cycle process (Example 9), and stators from the present single cycle process (Example 10). The stators had the following nominal dimensions: an inner diameter (ID) of 11.25 inches, an outer diameter (OD) of 19.5 inches, and a thickness of 1 inch. The rotors had the following nominal dimensions: an inner diameter of 12.375 inches, an outer diameter of 20.75 inches, and a thickness of 0.8 inch. The following density measurements were taken: bulk density of the entire part; density of the core, defined as the middle point from ID to OD and from top to bottom; at the outer diameter of the part (centered around a point about 0.25 inch in from the outer surface and midway from top to bottom); and at the inner diameter of the part (centered around a point about 0.25 inch in from the inner surface and midway from top to bottom). The density was measured by cutting up samples and measuring the density of the samples.

Table 1 shows the density difference between the core and the bulk density for Comparative Examples A and B and Examples 9 and 10. These values are indicative of the difference in density in the axial direction in the part. For the rotors made from the single cycle process, it can be seen that the density difference between the core and the bulk density was 0.021 g/cm$^3$, significantly less than the 0.028 g/cm$^3$ for the previously existing multi-cycle CVI/CVD process. Similarly, for the stators made from the single cycle process, the density difference between the core and the bulk density was surprisingly only 0.039 g/cm$^3$, much less than the 0.068 g/cm$^3$ for the previously existing multi-cycle CVI/CVD process.

TABLE 1

| | Bulk Density (g/cm$^3$) | Core Density (g/cm$^3$) | Difference between core and bulk densities (g/cm$^3$) |
|---|---|---|---|
| Comparative Example A | 1.800 | 1.772 | 0.028 |
| Example 9 | 1.830 | 1.809 | 0.021 |
| Comparative Example B | 1.795 | 1.727 | 0.068 |
| Example 10 | 1.800 | 1.761 | 0.039 |

Table 2 shows the density difference between a point at the outer diameter and the core and bulk densities for the rotors of Comparative Example A and Example 9. These values are indicative of the difference in density in the radial direction in the part. For the rotors made from the single cycle process, it can be seen that the difference in density at the outer diameter and the core density was only 0.006 g/cm$^3$, much less than the 0.059 g/cm$^3$ for the previously existing multi-cycle CVI/CVD process. The difference in density at the outer diameter and the bulk density was 0.027 g/cm$^3$, less than the 0.031 g/cm$^3$ for the previously existing multi-cycle CVI/CVD process.

TABLE 2

| | Bulk Density (g/cm$^3$) | OD Density (g/cm$^3$) | Core Density (g/cm$^3$) | Difference between OD and Core densities (g/cm$^3$) | Difference between OD and bulk densities (g/cm$^3$) |
|---|---|---|---|---|---|
| Comparative Example A | 1.800 | 1.831 | 1.772 | 0.059 | 0.031 |
| Example 9 | 1.830 | 1.803 | 1.809 | 0.006 | 0.027 |

Table 3 shows the density difference between a point at the inner diameter and the core and bulk densities for the stators of Comparative Example B and Example 10. These values are indicative of the difference in density in the radial direction in the part. For the stators made from the single cycle process, it can be seen that the difference in density at the inner diameter and the bulk density was only 0.055 g/cm$^3$, much less than the 0.134 g/cm$^3$ for the previously existing multi-cycle CVI/CVD process. The difference in density at the outer diameter and the bulk density was only 0.016 g/cm$^3$, much less than the 0.066 g/cm$^3$ for the previously existing multi-cycle CVI/CVD process.

TABLE 3

| | Bulk Density (g/cm$^3$) | ID Density (g/cm$^3$) | Core Density (g/cm$^3$) | Difference between ID and Core densities (g/cm$^3$) | Difference between ID and bulk densities (g/cm$^3$) |
|---|---|---|---|---|---|
| Comparative Example B | 1.795 | 1.861 | 1.727 | 0.134 | 0.066 |
| Example 10 | 1.800 | 1.816 | 1.761 | 0.055 | 0.016 |

The brake disks produced by the present process preferably have a density of at least about 1.75 g/cm$^3$. The difference between the core density and the bulk density is preferably less than 0.10 g/cm$^3$, more preferably less than 0.06 g/cm$^3$, even more preferably less than 0.04 g/cm$^3$, and most preferably less than 0.025 g/cm$^3$. The difference between the outer diameter density and the core density is preferably less than 0.06 g/cm$^3$, more preferably less than 0.05 g/cm$^3$, even more preferably less than 0.02 g/cm$^3$, and most preferably less than 0.01 g/cm$^3$. The difference between the inner diameter density and the core density is preferably less than 0.10 g/cm$^3$, more preferably less than 0.06 g/cm$^3$, and most preferably less than 0.05 g/cm$^3$. Thus, it can be seen that the process of the present invention is able to provide densified brake disks with surprisingly superior density gradients, compared to brake disks from a previously existing multi-cycle CVI/CVD process.

An additional benefit of the lower density gradients in the disks of Examples 9 and 10 is longer wear life. Wear testing of brake disks in a new condition on a dynamometer showed an average wear rate of 0.112 isk (inches per surface per 1000 landings) for the disks of Examples 9 and 10. The disks of Comparative Examples A and B averaged 0.140 isk. Thus, the disks from Examples 9 and 10 showed a wear life improvement of 20%. In the fully worn condition (i.e. with the disks at the minimum allowable thicknesses), the disks of Examples 9 and 10 had an average wear rate of 0.136 isk, which is about the same wear rate of standard production disks in the new, full-thickness condition (0.140 isk). It is believed that a principal reason for this wear improvement, through the life of the disks, is the lower density gradient in the disk produced from the single cycle process of the present invention.

Although the present invention has been described with reference to preferred embodiments, those skilled in the art will recognize that changes may be made and formed in detail without departing from the spirit and scope of the invention. It is therefore intended that the foregoing detailed description be regarded as illustrative rather than limiting, and that it be understood that it is the following claims, including all equivalents, that are intended to define the scope of this invention.

What is claimed is:

1. A process for densifying porous structures comprising:
   assembling a multitude of porous structures and ring-like spacers in a stack with a ring-like spacer between each adjacent pair of porous structures;
   disposing, in a furnace defining an outer volume, the stack of porous structures between a bottom plate and a top plate in the furnace, wherein the bottom plate, the stack of porous structures, and the ring-like spacers define an enclosed cavity extending from the bottom plate, including each porous structure aperture, and terminating proximate the top plate;
   providing at least one channel for fluid communication between the enclosed cavity and the outer volume;
   performing a one cycle, pressure gradient CVI/CVD process comprising:
   introducing a gas composition into the enclosed cavity;
   allowing a portion of the gas composition to flow through the channel while maintaining a pressure gradient between the enclosed cavity and the outer volume; and
   providing the gas composition in the outer volume at an initial pressure of at least about 15 torr,
   wherein a porous structure of the stack of porous structures is densified from an average density of less than about 0.60 g/cm$^3$ to an average density of greater than 1.70 g/cm$^3$ in the one cycle.

2. The process of claim 1 wherein the at least one channel for fluid communication between the enclosed cavity and the outer volume is provided in at least one of the ring-like spacers.

3. The process of claim 1 wherein the at least one channel for fluid communication between the enclosed cavity and the outer volume comprises a plurality of channels provided in the ring-like spacers, the plurality of channels comprising a total open area of between 0.5 in$^2$ and 6.0 in$^2$ and the gas composition flowing into the enclosed cavity at a rate of between 300 scfh and 900 scfh.

4. The process of claim 1 wherein the at least one channel for fluid communication between the enclosed cavity and the outer volume comprises a plurality of channels provided in the ring-like spacers, the plurality of channels comprising a open area of between 0.01 in$^2$ and 0.12 in$^2$ per porous structure and the gas composition flowing into the enclosed cavity at a rate of between 6 scfh and 18 scfh per porous structure.

5. The process of claim 1 further comprising maintaining the pressure of the gas composition in the outer volume at between about 15 torr and about 30 torr.

6. The process of claim 1 further comprising decreasing the pressure of the gas composition in the outer volume from the initial pressure to a second pressure.

7. The process of claim 6 wherein the second pressure of the gas composition in the outer volume is between 1 torr and 10 torr less than the initial pressure.

8. The process of claim 6 wherein the gas composition in the outer volume is decreased from the initial pressure to the second pressure over a period of time of between 100 hours and 300 hours.

9. The process of claim 1 further comprising allowing the pressure of the gas composition in the enclosed cavity to increase from a first pressure to a second pressure during the densification process.

10. The process of claim 9 wherein the first pressure of the gas in the enclosed cavity is between 20 torr and 30 torr.

11. The process of claim 10 wherein the second pressure of the gas in the enclosed cavity is at least 5 torr greater than the first pressure.

12. The process of claim 1 wherein the pressure of the gas composition in the enclosed cavity is maintained at less than 40 torr.

13. The process of claim 1 wherein the pressure of the gas composition in the enclosed cavity is maintained at less than 30 torr.

14. The process of claim 1 wherein the pressure gradient between the enclosed cavity and the outer volume is maintained at greater than 1 torr.

15. The process of claim 1 further comprising the step of regulating the pressure gradient between the enclosed cavity and the outer volume so that it does not exceed 25 torr.

16. The process of claim 15 wherein the pressure gradient is between 1 torr and 10 torr at the start of the densification process, and between 3 torr and 10 torr at the end of the densification process.

17. The process of claim 1 further comprising the step of regulating the pressure gradient between the enclosed cavity and the outer volume so that it does not exceed 10 torr.

18. The process of claim 1 wherein the gas composition introduced into the enclosed cavity comprises between 5% and 20% highly reactive gas.

19. The process of claim 18 wherein the highly reactive gas is selected from the group consisting of ethane, propane, and mixtures thereof.

20. The process of claim 18 wherein the amount of highly reactive gas introduced into the enclosed cavity decreases during the densification process.

21. The process of claim 20 wherein the gas composition introduced into the enclosed cavity comprises between 10% and 18% highly reactive gas at the start of the densification process and between 5% and 10% highly reactive gas at the end of the densification process.

22. The process of claim 1 wherein the one cycle comprises less than 700 hours on gas.

23. The process of claim 1 wherein the one cycle comprises less than 600 hours on gas.

24. The process of claim 1 wherein the one cycle comprises less than 400 hours on gas.

25. The process of claim 1 further comprising machining the densified porous structures into brake disks.

26. The process of claim 1 wherein the one cycle comprises less than 400 hours on gas.

27. A process for densifying porous structures comprising:
assembling a multitude of porous structures and ring-like spacers in a stack with a ring-like spacer between each adjacent pair of porous structures;
disposing, in a furnace defining an outer volume, the stack of porous structures between a bottom plate and a top plate in the furnace, wherein the bottom plate, the stack of porous structures, and the ring-like spacers define an enclosed cavity extending from the bottom plate, including each porous structure aperture, and terminating proximate the top plate;
providing a channel for fluid communication between the enclosed cavity and the outer volume;
performing a one cycle, pressure gradient CVI/CVD process comprising;
introducing a gas composition into the enclosed cavity, wherein the gas composition comprises between 5% and 20% highly reactive gas at the start of the one cycle, pressure gradient CVI/CVD process, and the amount of highly reactive gas decreases during the one cycle, pressure gradient CVI/CVD process;
allowing a portion of the gas composition to flow through the channel while maintaining a pressure gradient between the enclosed cavity and the outer volume; and
providing the gas composition in the outer volume,
wherein a porous structure of the stack of porous structures is densified from an average density of less than about 0.60 g/cm$^3$ to an average density of greater than 1.70 g/cm$^3$ in the one cycle.

28. The process of claim 27 wherein the highly reactive gas is selected from the groups consisting of ethane, propane, and mixtures thereof.

29. The process of claim 27 wherein the gas composition introduced into the enclosed cavity comprises between 10% and 18% highly reactive gas at the start of the densification process and between 5% and 10% at the end of the densification process.

30. The process of claim 27 wherein the gas composition introduced into the enclosed cavity comprises between 10% and 18% highly reactive gas at the start of the densification process and between 5% and 10% highly reactive gas when the porous structures have an average density of at least about 1.0 g/cm$^3$.

31. The process of claim 27 wherein the pressure of the gas composition in the outer volume is maintained at greater than 15 torr.

32. The process of claim 27 further comprising the step of regulating the pressure gradient between the enclosed cavity and the outer volume so that it does not exceed 25 torr.

33. The process of claim 27 further comprising the step of regulating the pressure gradient between the enclosed cavity and the outer volume so that it does not exceed 10 torr.

34. The process of claim 27 wherein the pressure gradient between the enclosed cavity and the outer volume is maintained at greater than 1 torr.

* * * * *